(12) United States Patent
Peng et al.

(10) Patent No.: US 7,335,540 B2
(45) Date of Patent: Feb. 26, 2008

(54) LOW TEMPERATURE POLYSILICON THIN FILM TRANSISTOR AND METHOD OF MANUFACTURING THE SAME

(75) Inventors: Chia-Tien Peng, Hsinchu Hsien (TW); Ming-Wei Sun, Kaohsiung (TW)

(73) Assignee: Au Optronics Corporation, Hsinchu (TW)

( * ) Notice: Subject to any disclaimer, the term of this patent is extended or adjusted under 35 U.S.C. 154(b) by 47 days.

(21) Appl. No.: 10/604,651

(22) Filed: Aug. 7, 2003

(65) Prior Publication Data
US 2004/0219723 A1 Nov. 4, 2004

(30) Foreign Application Priority Data
Apr. 16, 2003 (TW) .............................. 92108769 A

(51) Int. Cl.
*H01L 21/84* (2006.01)
*H01L 21/00* (2006.01)

(52) U.S. Cl. ............... 438/166; 438/164; 257/E27.111; 257/E29.278

(58) Field of Classification Search ................ 438/151, 438/164, 166

See application file for complete search history.

(56) References Cited

U.S. PATENT DOCUMENTS 5,563,093 A * 10/1996 Koda et al. .................. 438/231
6,610,142 B1 * 8/2003 Takayama et al. ............. 117/8

FOREIGN PATENT DOCUMENTS

JP 2001-345447 12/2001

OTHER PUBLICATIONS

Jen et al, Effects of N2O Plasma treatment . . . , Japanese Journal of Applied Physics, Part 2, Letter 1994.*
Luan et al, Effects of NH3 Plasma, J. Applied Physics, 68(7), Oct. 1990.*
Jen et al, Effects of N2O Plasma Treatment, Japanese Journal of Applied Physics, Part 2, Letter 1994.*
Luan et al, Effects of NH3 Plasma, J. of Applied Physics, 68 (7), Oct. 1990.*

* cited by examiner

*Primary Examiner*—Alexander Ghyka
(74) *Attorney, Agent, or Firm*—Jianq Chyun IP Office

(57) ABSTRACT

A low temperature polysilicon thin film transistor and method of manufacturing the same is provided. The low temperature polysilicon thin film transistor comprises a channel region. Among others, one feature of the method according to the present invention is the performance of a plasma treatment to adjust the threshold voltage of the low temperature polysilicon thin film transistor. Because the threshold voltage of the low temperature polysilicon thin film transistor can be adjusted through a plasma treatment, the manufacturing process is more flexible.

27 Claims, 5 Drawing Sheets

LOW TEMPERATURE POLYSILICON THIN FILM TRANSISTOR AND METHOD OF MANUFACTURING THE SAME

CROSS REFERENCE TO RELATED APPLICATIONS

This application claims the priority benefit of Taiwan application serial no. 92108769, filed Apr. 16, 2003.

BACKGROUND OF INVENTION

1. Field of Invention

The present invention relates to a low temperature polysilicon (LTPS) thin film transistor (TFT) and method of manufacturing the same. More particularly, the present invention relates to a highly flexible manufacturing of fabricating low temperature polysilicon thin film transistors.

2. Description of Related Art

An outcome of the rapid progress in high-tech products is the popularity of video products such as digital video or imaging devices in our daily life. To be useful, these digital video and imaging devices must provide a high-quality display so that a user can operate a controlling device after reading some important information disseminated from the display.

Thin film transistors are the principle driving devices inside a liquid crystal display (LCD). With a flat and stream-line design, LCD has become one of the most popular vertically erected desktop monitors serving personal computers and game machines. Among the thin film transistor liquid crystal displays, one type of display has internal thin film transistors fabricated using a polysilicon technique that can reduce electron mobility relative to a thin film transistor fabricated using the conventional amorphous silicon technique. In general, a thin film transistor having higher electron mobility can have a smaller dimension and a larger aperture ratio so that the display is able to attain a higher brightness level and consume less power. Furthermore, the increase in electron mobility also permits the fabrication of part of the driving circuits and the thin film transistors together on a glass substrate to improve the performance and reliability of the liquid crystal display panel. Therefore, overall cost of producing the liquid crystal display panel is lowered considerably compared with the amorphous silicon thin film transistor liquid crystal display. In addition, since the polysilicon can be fabricated into light and thin sheets of material, it finds many applications in lightweight and low-power portable equipment. However, the conventional method of annealing the amorphous silicon to transform the amorphous silicon into polysilicon demands a temperature of over 600° C. Hence, the substrate must be fabricated using heat-resistant quartz material. Yet, a quartz substrate not only is more expensive than a glass substrate, but a quartz substrate having a linear dimension greater than 2 to 3 inches is also difficult to produce. Because of such limitations, polysilicon thin film transistor panels are formed in relatively small display panels in the past.

To lower production cost, glass is the preferred material for forming the substrate. When a glass substrate is used, the polysilicon layer within the thin film transistors must be produced at a temperature below 500° C. A number of methods for annealing the amorphous silicon at a lower temperature have been developed. One of the most convenient and widely adopted methods is laser annealing. Laser annealing is capable of producing high quality, contamination-free and low-defect-density polysilicon layer. These polysilicon thin film transistors fabricated at a relatively low annealing temperature are frequently referred to as "low temperature thin film transistors."

At present, the threshold voltage of the low temperature polysilicon thin film transistors is adjusted by performing an ion implantation or an ion shower process. However, both processes demand an ion implantation apparatus. Thus, flexibility in the manufacturing polysilicon thin film transistors is restricted.

SUMMARY OF INVENTION

Accordingly, one object of the present invention is to provide a low temperature polysilicon thin film transistor and method of manufacturing the same such that a plasma chemical vapor deposition apparatus can be selected to adjust the threshold voltage of the low temperature thin film transistor. Hence, the process for fabricating the low temperature polysilicon thin film transistor is more flexible.

To achieve these and other advantages and in accordance with the purpose of the invention, as embodied and broadly described herein, the invention provides a method of fabricating a low temperature polysilicon thin film transistor. The low temperature polysilicon thin film transistor has a channel region. One aspect of the present invention is that a plasma treatment to the channels carried out to the channel region for adjusting the threshold voltage of the low temperature polysilicon thin film transistor.

The present invention also provides a method of fabricating a low temperature polysilicon thin film transistor. First, an amorphous silicon layer is formed over a substrate. Thereafter, a plasma treatment is carried out to adjust the threshold voltage. A laser annealing process is performed to transform the amorphous silicon layer into a polysilicon layer. The polysilicon layer is next patterned to form a plurality of island polysilicon layers. A channel region is formed in each island polysilicon layer and then a doped source/drain region is formed on each side to the channel region. Finally, a gate is formed over the channel region.

According to one embodiment of the present invention, a plasma treatment is carried out using oxygen-containing plasma such as nitrous oxide ($N_2O$) plasma so that the threshold voltage of the thin film transistor is adjusted in the negative direction. Alternatively the plasma treatment is carried out using hydrogen-containing plasma such as ammonia plasma ($NH_3$) or hydrogen plasma ($H_2$) so that the threshold voltage of the thin film transistor is adjusted in the positive direction. In addition, the desired shift in threshold voltage of the low temperature polysilicon thin film transistor can be set by adjusting the processing time or varying the radio frequency power in the plasma treatment.

The present invention also provides a low temperature polysilicon thin film transistor comprising a polysilicon layer, a gate and a gate insulation layer. The gate insulation layer is positioned between the gate and the polysilicon layer. The polysilicon layer has a channel region. One aspect of the present invention is that the concentration of oxygen within the channel region is between 1E19 to 1E23 atoms/cc while the concentration of nitrogen within the channel region is between 5E16 to 1E19 atoms/cc.

Because the present invention uses existing equipment such as plasma chemical vapor deposition (PECVD) apparatus to carry out a plasma treatment and adjust the threshold voltage of the thin film transistor is the positive or the negative direction, there is no need to use an ion implantation apparatus. Hence, the manufacturing process according to the present invention is more flexible.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
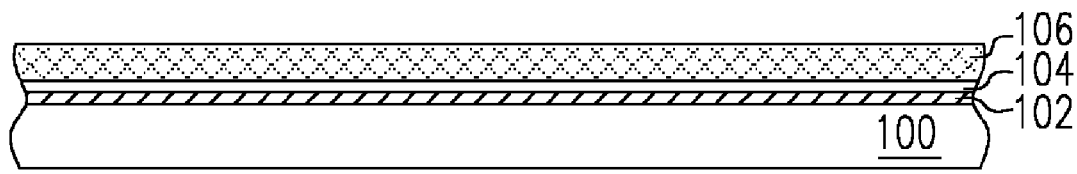
FIGS. 1A to 1J are schematic cross-sectional views showing the progression of steps for fabricating a low temperature polysilicon thin film transistor according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1J are schematic cross-sectional views showing the progression of steps for fabricating a low temperature polysilicon thin film transistor according to one preferred embodiment of the present invention. First, as shown in FIG. 1A, a buffer layer is selectively formed over a substrate 100. The buffer layer is a stack layer comprising a silicon nitride layer 102 and silicon oxide layer 104, for example. The buffer layer mainly serves to increase the adhesive strength of the substrate 100 with a subsequently formed polysilicon layer and to prevent any metallic ions such as sodium ions in the substrate 100 from contaminating the polysilicon layer. Thereafter, an amorphous silicon layer 106 is formed over the silicon oxide layer 104.

Figure 1B:
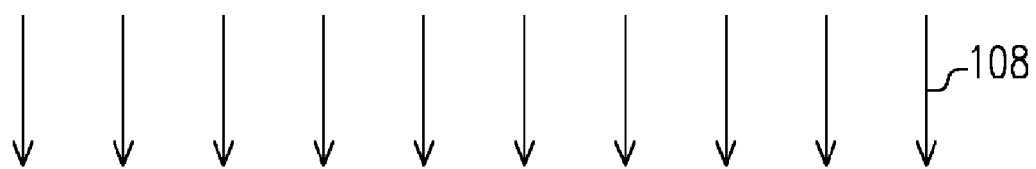
Figure 1B:
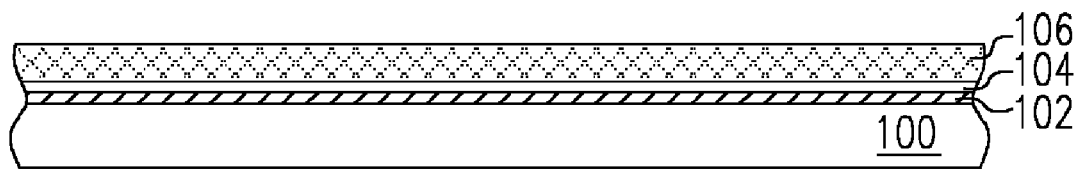

As shown in FIG. 1B, a plasma treatment 108 is carried out to adjust the threshold voltage of the low temperature polysilicon thin film transistor. The plasma treatment 108 can be performed using existing equipment such as the plasma-enhanced chemical vapor deposition (PECVD) apparatus. For example, oxygen-containing plasma such as nitrous oxide ($N_2O$) plasma is used to adjust the threshold voltage of the thin film transistor in the negative direction or hydrogen-containing plasma such as ammonia plasma ($NH_3$) or hydrogen plasma ($H_2$) is used to adjust the threshold voltage of the thin film transistor in the positive direction. In addition, the desired shift in threshold voltage of the low temperature polysilicon thin film transistor can be set by adjusting the processing time or varying the radio frequency power in the plasma treatment 108.

Figure 1C:
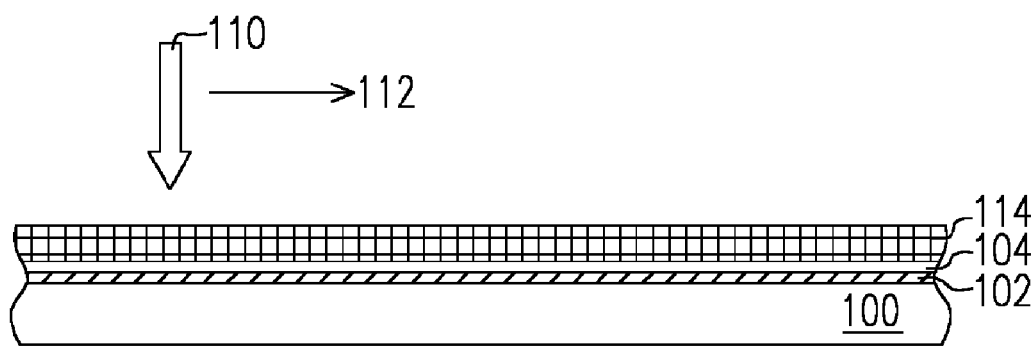

As shown in FIG. 1C, a laser annealing process including excimer laser annealing is performed. In FIG. 1C, the hollow white arrow representing a beam of laser sweeps across the surface of the substrate 100 along the direction 112 so that the amorphous silicon inside the amorphous silicon layer 106 is able to melt and re-crystallize into a polysilicon layer 114.

Figure 1D:
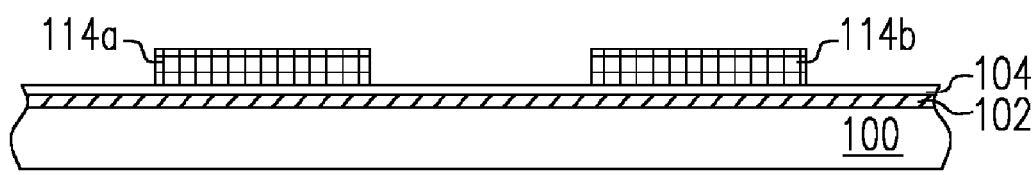

As shown in FIG. 1D, the polysilicon layer 114 is patterned to form a plurality of island polysilicon layers 114a, 114b. Since polysilicon has a relatively high electron mobility, peripheral circuits including complementary metal-oxide-semiconductor (CMOS) transistors can also be fabricated within the peripheral region outside the display region when the thin film transistor array inside the display region is fabricated. Thus, the CMOS process for fabricating P-type and N-type thin film transistors is also described. In the following, the island polysilicon layer 114a is a portion of the desired P-type thin film transistor and the island polysilicon layer 114b is a portion of the desired N-type thin film transistor, for example. However, the simultaneous fabrication of the P-type and the N-type thin film transistors serves as an example of the fabrication process only and should not be construed as a limitation of the present invention.

Figure 1E:
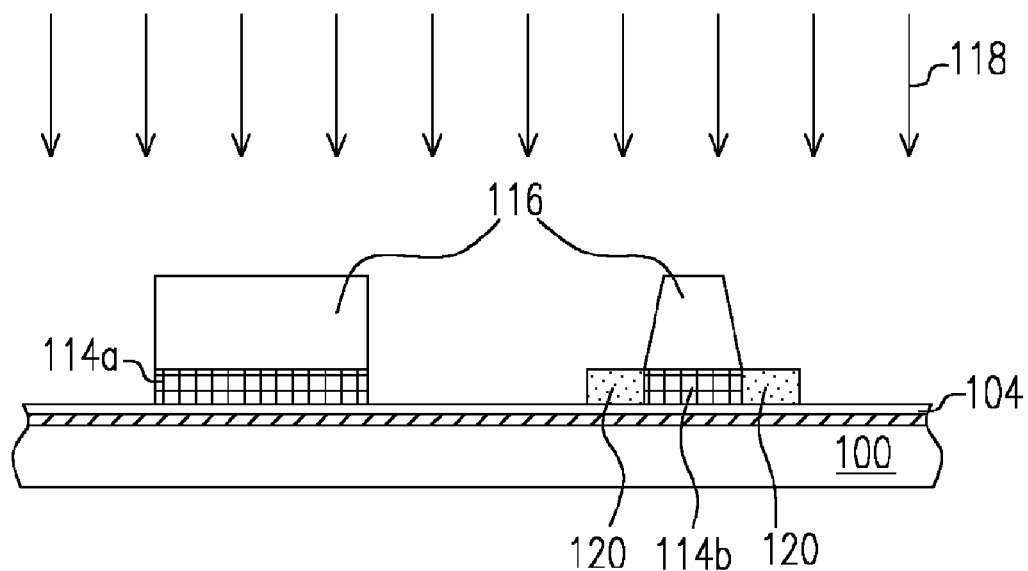

As shown in FIG. 1E, a patterned photoresist layer 116 is formed over the substrate 100 to cover the island polysilicon layer 114a and a portion of the island polysilicon layer 114b and expose the upper surface on each side of the island polysilicon layer 114b. Thereafter, an $n^+$ doping process 118 is carried out to form the doped source/drain regions 120 of an N-type thin film transistor on each side of the island polysilicon layer 114b.

Figure 1F:
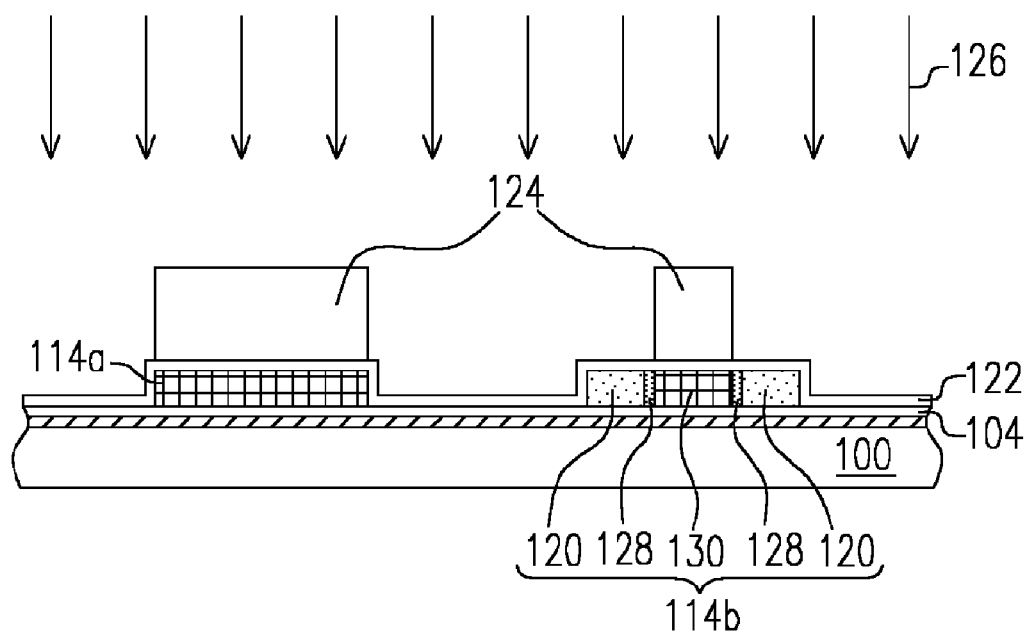

As shown in FIG. 1F, the patterned photoresist layer 116 is removed. Thereafter, a gate insulation layer 112 is formed over the island polysilicon layers 114a, 114b and the silicon oxide layer 104. Another patterned photoresist layer 124 is formed over the gate insulation layer 122 to cover the island polysilicon layer 114a and a portion of the polysilicon layer 114b and expose the area within the island polysilicon layer 114b adjacent to the doped source/drain region 120. An n– doping process 126 is carried out to form lightly doped drain regions 128 in the N-type thin film transistor and simultaneously defined a channel region 130 between the lightly doped drain regions 128.

Figure 1G:
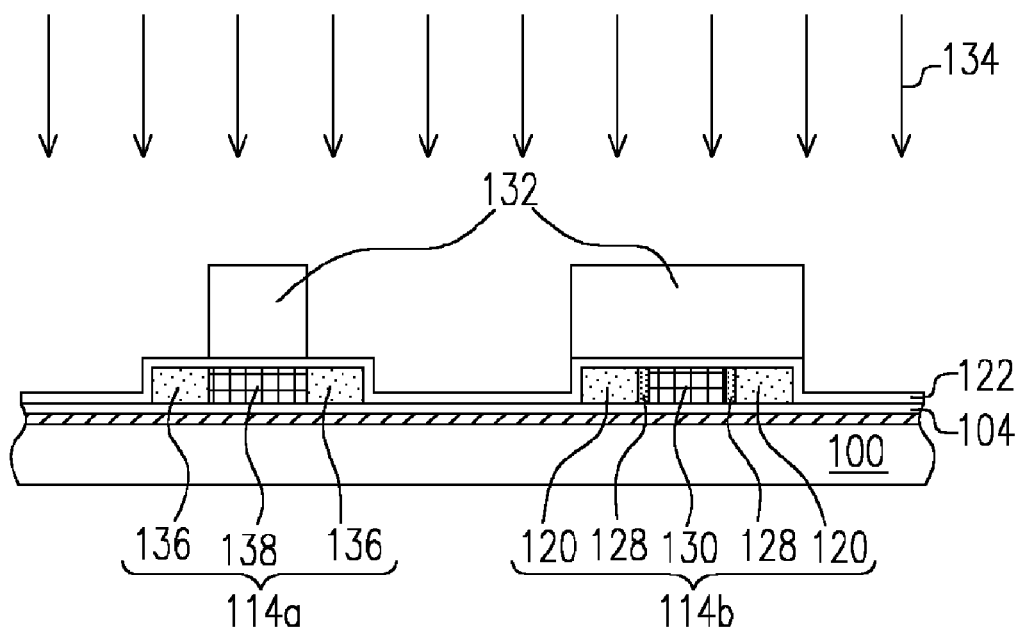

As shown in FIG. 1G, the patterned photoresist layer 124 is removed. Thereafter, another patterned photoresist layer 132 is formed over the gate insulation layer 122 to cover the island polysilicon layer 114b and a portion of the island polysilicon layer 114a and expose the upper surface on each side of the island polysilicon layer 114b. A p+ doping process 134 is carried out to form the doped source/drain regions 136 of a P-type thin film transistor and defined a channel region 138 between the doped source/drain regions 136.

Figure 1H:
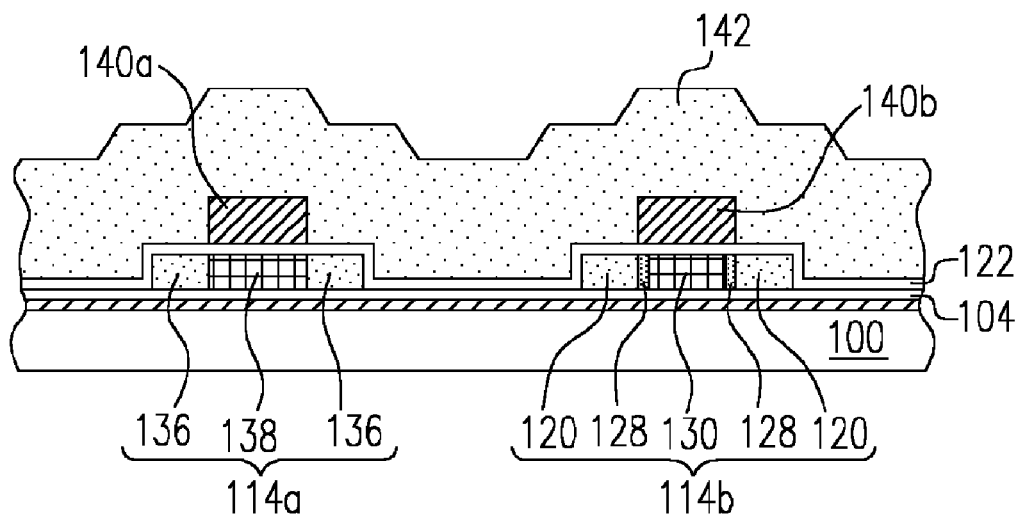

As shown in FIG. 1H, the patterned photoresist layer 132 is removed. An activation process can be performed selectively before fabricating the gate. Thereafter, gates 140a, 140b are formed over the channel regions 138 and 130 respectively. An inter-layer dielectric 142 is formed over the substrate 100 to cover the island polysilicon layers 114a, 114b and the gates 140a, 140b.

Figure 1I:
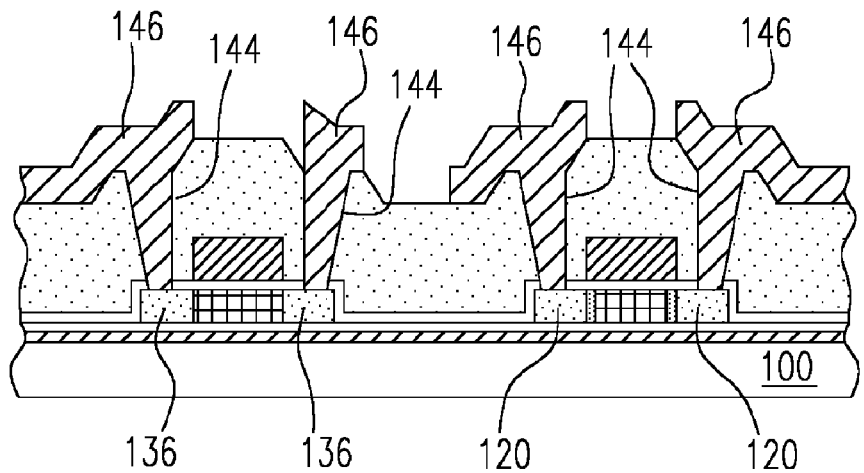

As shown in FIG. 1I, a plurality of openings 144 is formed in the inter-layer dielectric 142 and the gate insulation layer 122. The openings 144 expose the doped source/drain regions 136 and 120. Thereafter, a plurality of source/drain metallic contacts 146 are formed over the inter-layer dielectric 142 and within the openings 144 so that the source/drain metallic contacts 146 are electrically connected to the doped source/drain regions 136 and 120.

Figure 1J:
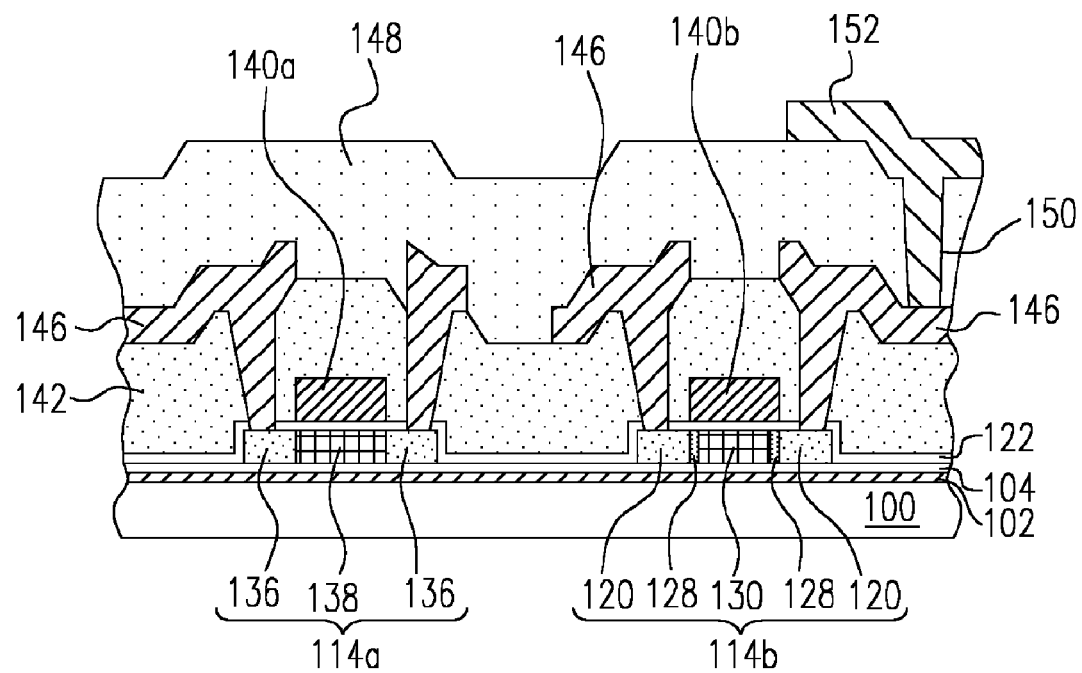

As shown in FIG. 1J, a passivation layer 148 is formed over the substrate 100. Thereafter, an opening 150 that exposes a portion of the source/drain metallic contact 146 is formed in the passivation layer 148. The passivation layer 146 is a silicon nitride layer, for example. Finally, a pixel electrode 152 is formed over the passivation layer such that the pixel electrode and the source/drain metallic contact 146 are electrically connected via the opening 150. The pixel electrode 152 is fabricated using a material including, for example, indium-tin oxide (ITO). Because existing equipment is used to carry out the plasma treatment for adjusting the threshold voltage of the polysilicon thin film transistors in the positive or the negative direction, the manufacturing process is more flexible.

In addition, as shown in FIG. 1J, the low temperature polysilicon thin film transistor of the present invention at least comprises a pair of island polysilicon layers 114a, 114b, a pair of gates 140a, 140b and a gate insulation layer 122. The gates 140a, 140b are positioned over a substrate 100. The island polysilicon layers 114a, 114b are positioned between the gates 140a, 140b and the substrate 100. The gate insulation layer 122 is positioned between the gates 140a, 140b and the island polysilicon layers 114a, 114b. Furthermore, the island polysilicon layer 114a has a channel region 138 and a pair of doped source/drain regions 136. The channel region 138 is positioned underneath the gate 140a and the doped source/drain regions 136 are positioned on each side to the channel region 138. Similarly, the island polysilicon layer 114b has a channel region 130 and a pair of doped source/drain regions 120. The channel region 130 is positioned underneath the gate 140b and the doped source/drain regions 120 are positioned on each side to the channel region 130.

The concentration of oxygen within the channel regions 138, 130 are between 1E19 to 1E23 atoms/cc while the concentration of nitrogen within the channel regions 138, 130 are between 5E16 to 1E19 atoms/cc if, for example, nitrous oxide ($N_2O$) is used in the plasma treatment. In addition, the method according to the present invention can be applied to fabricate other types of thin film transistors including the bottom gate low temperature polysilicon thin film transistors as well.

One major aspect of the present invention is the utilization of existing equipment such as a plasma-enhanced chemical vapor deposition apparatus to perform a plasma treatment of the amorphous silicon layer and adjust the threshold voltage of the thin film transistors in a positive or a negative direction before laser annealing. Unlike the conventional method, using an ion implantation apparatus to perform an ion implantation operation is non-essential. Hence, the fabrication process is more flexible.

It will be apparent to those skilled in the art that various modifications and variations can be made to the structure of the present invention without departing from the scope or spirit of the invention. In view of the foregoing, it is intended that the present invention cover modifications and variations of the present invention provided they fall within the scope of the following claims and their equivalents.

The invention claimed is:

1. A method of forming a low temperature polysilicon thin film transistor, comprising:
   forming an amorphous silicon layer over a substrate;
   performing a plasma treatment to the amorphous silicon layer, wherein the plasma treatment is selected from nitrous oxide ($N_2O$) plasma, ammonia ($NH_3$) plasma or hydrogen ($H_2$) plasma, and there is no film layer formed on the surface of the amorphous silicon layer after the plasma treatment is performed;
   transforming the amorphous silicon layer into a polysilicon layer;
   patterning the polysilicon layer to form a plurality of island polysilicon layers;
   forming a channel region and a doped source/drain region on each side of the channel region in each island polysilicon layer; and
   forming a gate over each channel region, wherein the channel region composed of polysilicon has an adjusted threshold voltage determined by the plasma treatment.

2. The method of claim 1, wherein the plasma treatment is nitrous oxide ($N_2O$) plasma, and the threshold voltage of the channel region is adjusted in the negative direction.

3. The method of claim 1, wherein the plasma treatment is ammonia ($NH_3$) plasma or hydrogen ($H_2$) plasma, and the threshold voltage of the channel region is adjusted in the positive direction.

4. The method of claim 1, wherein the desired shift in the threshold voltage is effected by varying the radio frequency power to the plasma treatment.

5. The method of claim 1, wherein the desired shift in the threshold voltage is effected by varying the processing period of the plasma treatment.

6. The method of claim 1, wherein the step of patterning the polysilicon layer further comprises forming a gate insulation layer over the island polysilicon layers.

7. A method of forming a low temperature polysilicon thin film transistor, comprising:
   providing a substrate;
   forming an amorphous silicon layer over the substrate;
   performing a plasma treatment to the amorphous silicon layer, wherein the plasma treatment is selected from nitrous oxide ($N_2O$) plasma, ammonia ($NH_3$) plasma or hydrogen ($H_2$) plasma, and there is no film layer formed on the surface of the amorphous silicon layer after the plasma treatment is performed;
   performing a laser annealing process to transform the amorphous silicon layer into a polysilicon layer;
   patterning the polysilicon layer to form a plurality of island polysilicon layers;
   forming a gate insulation layer over the island polysilicon layers;
   forming a channel region in each island polysilicon layer and a doped source/drain region on each side to the channel regions; and
   forming a gate over the channel regions, wherein the channel region composed of polysilicon has an adjusted threshold voltage determined from the plasma treatment.

8. The method of claim 7, wherein the plasma treatment is nitrous oxide ($N_2O$) plasma, and the threshold voltage of the channel region is adjusted in the negative direction.

9. The method of claim 7, wherein the plasma treatment is ammonia ($NH_3$) plasma or hydrogen ($H_2$) plasma, and the threshold voltage of the channel region is adjusted in the positive direction.

10. The method of claim 7, wherein the desired shift in the threshold voltage is effected by varying the radio frequency power to the plasma treatment.

11. The method of claim 7, wherein the desired shift in the threshold voltage is effected by varying the processing period of the plasma treatment.

12. The method of claim 7, wherein the laser annealing process comprises performing an excimer laser annealing process.

13. The method of claim 7, wherein the step of forming the amorphous silicon layer over the substrate, further comprises:
   forming a silicon nitride layer over the substrate; and
   forming a silicon oxide layer over the silicon nitride layer.

14. The method of claim 7, wherein the step of forming a channel layer in each island polysilicon layer and a doped source/drain region on each side to the channel region further comprises:
   forming a first patterned photoresist layer over the gate insulation layer to expose the upper surface of on each side of each island polysilicon layer; and
   performing a $p^+$ doping process.

15. The method of claim 14, wherein the step of performing the p+ doping process further comprises removing the first patterned photoresist layer.

16. The method of claim 7, wherein the step of forming a channel region in each island polysilicon layer and a doped source/drain region on each side to the channel region further comprises:
forming a second patterned photoresist layer over the substrate to cover a portion of the various island polysilicon layers and expose the upper surface on each side of the island polysilicon layers; and
performing an n+ doping process.

17. The method of claim 16, wherein the step of performing the n+ doping process further comprises removing the second patterned photoresist layer.

18. The method of claim 17, wherein the step of removing the second patterned photoresist layer further comprises:
forming a third patterned photoresist layer over the gate insulation layer to expose an area adjacent to the doped source/drain region of various island polysilicon layer; and
performing an n− doping process to form lightly doped drain regions.

19. The method of claim 18, wherein the step of performing the n− doping process further comprises removing the third patterned photoresist layer.

20. The method of claim 7, wherein the step of forming a gate over the channel regions further comprises performing an activation process.

21. The method of claim 7, wherein the step of forming a gate over the channel regions further comprises:
forming an inter-layer dielectric over the substrate;
forming a plurality of first openings in the inter-layer dielectric and the gate insulation layer to expose the doped source/drain regions; and
forming a plurality of source/drain metallic contacts over the inter-layer dielectric so that the source/drain metallic contacts and various doped source/drain regions are electrically connected via the first openings.

22. The method of claim 21, wherein the step of forming a plurality of source/drain metallic contacts further comprises:
forming a passivation layer over the substrate;
forming a second opening in the passivation layer to expose a portion of the source/drain metallic contact; and
forming a pixel electrode over the passivation layer such that the pixel electrode and a portion of the source/drain metallic contact are electrically connected through the second opening.

23. A method of forming a low temperature polysilicon thin film transistor, comprising:
forming an amorphous silicon layer over a substrate;
performing a plasma treatment to the amorphous silicon layer, wherein the plasma treatment is selected from nitrous oxide ($N_2O$) plasma, ammonia ($NH_3$) plasma or hydrogen ($H_2$) plasma;
performing a laser annealing process so as to transform the amorphous silicon layer into a polysilicon layer, wherein the beam of the laser annealing process directly emits into the amorphous layer;
patterning the polysilicon layer to form a plurality of island polysilicon layers;
forming a channel region and a doped source/drain region on each side of the channel region in each island polysilicon layer; and
forming a gate over each channel region, wherein the channel region composed of polysilicon has an adjusted threshold voltage determined by the plasma treatment.

24. The method of claim 23, wherein the plasma treatment is nitrous oxide ($N_2O$) plasma, and the threshold voltage of the channel region is adjusted in the negative direction.

25. The method of claim 23, wherein the plasma treatment is ammonia ($NH_3$) plasma or hydrogen ($H_2$) plasma, and the threshold voltage of the channel region is adjusted in the positive direction.

26. The method of claim 23, wherein the desired shift in the threshold voltage is effected by varying the radio frequency power to the plasma treatment.

27. The method of claim 23, wherein the desired shift in the threshold voltage is effected by varying the processing period of the plasma treatment.

* * * * *